United States Patent [19]
Kozono

[11] Patent Number: 6,107,689
[45] Date of Patent: *Aug. 22, 2000

[54] SEMICONDUCTOR DEVICE

[75] Inventor: Hiroyuki Kozono, Omiya, Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/902,093

[22] Filed: Jul. 29, 1997

[30] Foreign Application Priority Data

Jul. 30, 1996 [JP] Japan .................................. 8-200288

[51] Int. Cl.$^7$ .................................................. H01L 23/48
[52] U.S. Cl. ......................... 257/778; 257/737; 257/787
[58] Field of Search ................................... 257/738, 778, 257/723, 774, 737, 787

[56] References Cited

U.S. PATENT DOCUMENTS

| | | | |
|---|---|---|---|
| 5,350,947 | 9/1994 | Takekawa et al. .................... 257/702 |
| 5,543,663 | 8/1996 | Takubo ................................... 257/720 |
| 5,760,465 | 6/1998 | Alcoe et al. ............................ 257/669 |

FOREIGN PATENT DOCUMENTS

| | | | |
|---|---|---|---|
| 59-120884 | 7/1984 | Japan .................................... 257/778 |
| 1-191457 | 8/1989 | Japan . |
| 6-204272 | 7/1994 | Japan . |
| 93/15521 | 8/1993 | WIPO .................................. 257/778 |

*Primary Examiner*—Roy Potter
*Attorney, Agent, or Firm*—Finnegan, Henderson, Farabow, Garrett & Dunner, L.L.P.

[57] ABSTRACT

A semiconductor device according to the present invention includes a wiring substrate having a chip mounting face on which a connected portion is formed, a semiconductor chip having an element forming face on which externally connecting terminals are formed, the externally connecting terminals being electrically connected to the connected portion, and a resin-sealed layer formed between the wiring substrate and the semiconductor chip so as to cover at least a periphery of the semiconductor chip. The wiring substrate has a through hole bored from the chip mounting face to an undersurface thereof. Part of the through hole is formed outside a chip mounting region of the wiring substrate.

36 Claims, 7 Drawing Sheets

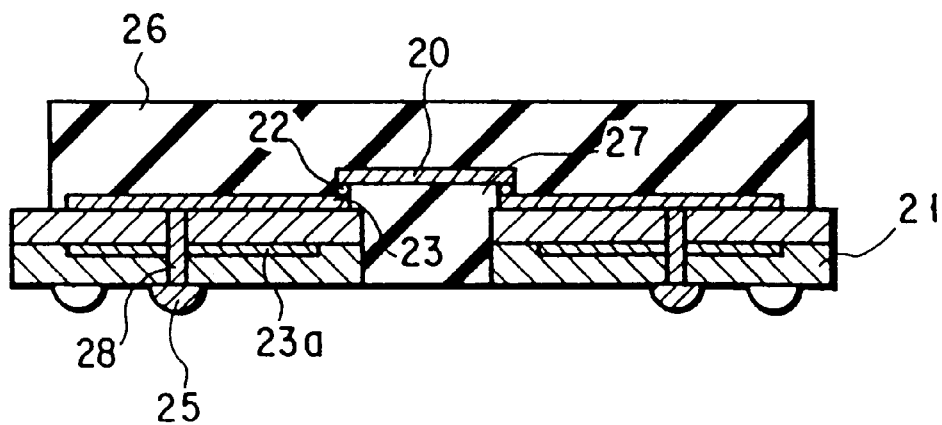
F I G. 7

F I G. 11
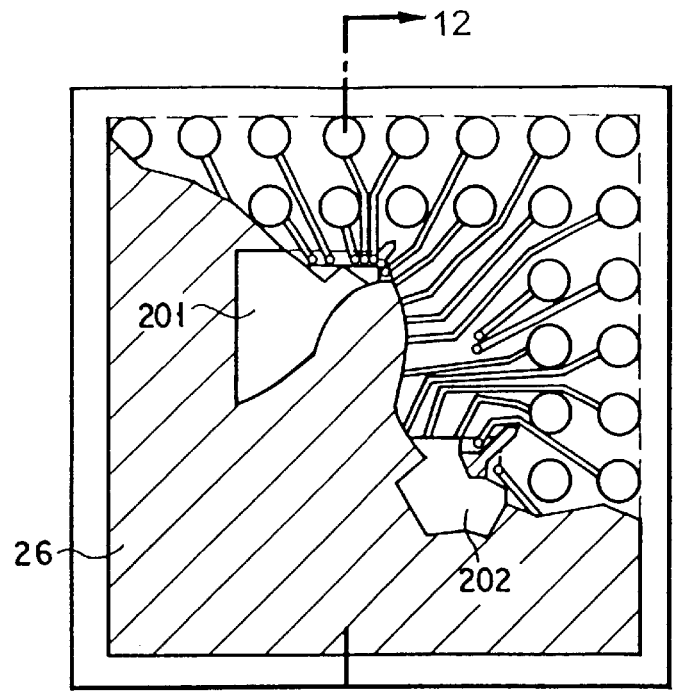
F I G. 12
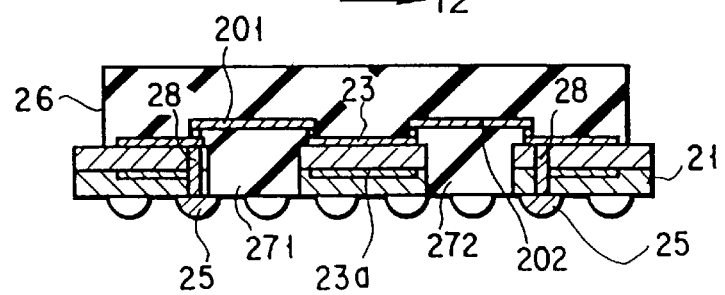
F I G. 13
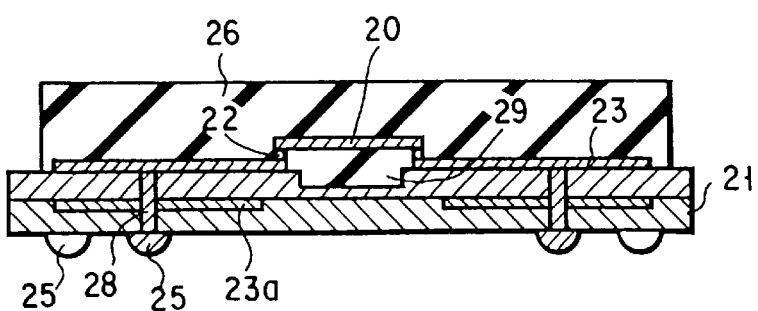
F I G. 14
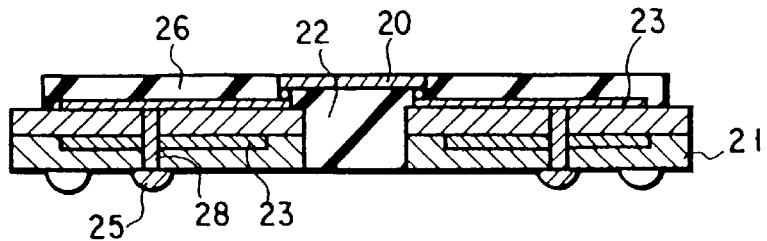

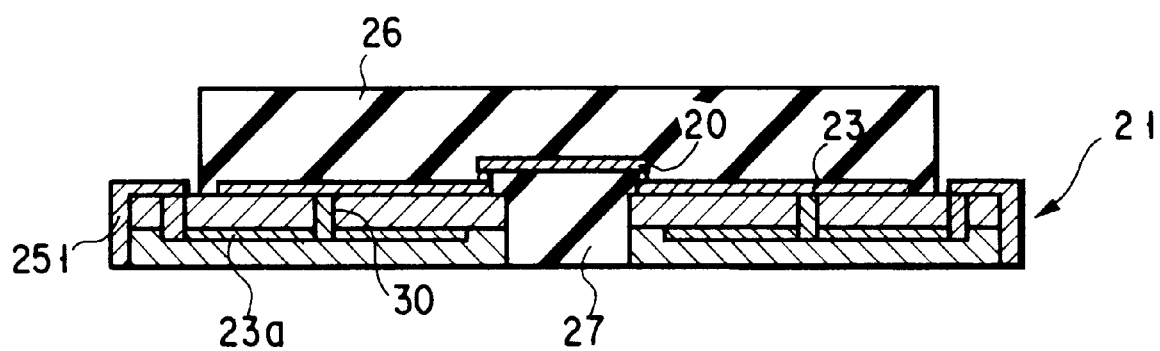
F I G. 15

6,107,689

SEMICONDUCTOR DEVICE

BACKGROUND OF THE INVENTION

The present invention relates to a semiconductor device and a method for manufacturing the same and, more specifically, to a semiconductor device having a single-sided resin-sealed package structure.

The present invention is applied to a semiconductor device having a multiple terminal of not less than 100 pins operated at a high frequency of a gigahertz band.

There is much demand for miniaturizing and thinning a package in a semiconductor device used in an IC card, a mask ROM card for games, a portable telephone, etc. To meet the demand, the technique of mounting a bare semiconductor chip (bare chip) has been developed, and chip-on-board (COB) mounting, flip-chip mounting, etc. are known.

In the flip-chip mounting, a metal bump electrode on an element forming face of the bare chip is pressed on and connected to an electrode pad formed on a chip mounting face on a wiring substrate (flip-chip bonding). Although flip-chip mounting is superior in mounting density to the COB mounting requiring wire bonding, it has a problem that stress due to thermal expansion of the substrate is applied to a connecting portion of the substrate and chip thereby to degrade the reliability of the connection.

As an example of an improvement of the flip-chip mounting, a single-sided resin-sealed package structure is known in which a substrate and a bare chip are mechanically fixed to each other by interposing resin between the substrate and chip.

FIG. 1 is a plan view illustrating the upper face of a prior art semiconductor device having a single-sided resin-sealed package structure. FIG. 2 is a plan view showing the lower face of the semiconductor device of FIG. 1. FIG. 3 is a cross-sectional view taken along line 3—3 of FIG. 2.

The package structure illustrated in FIGS. 1 to 3 includes a two-layered wiring substrate 11 having a connected portion and a wiring pattern 13 on the major face thereof, a semiconductor chip 10 mounted face down on a chip mounting face of the substrate 11 with a metal bump electrode 12 interposed therebetween, a resin-sealed layer 16 formed between the chip 10 and substrate 11, and an externally connecting terminal 15 guided and exposed to a no-chip mounting face of the substrate 11 and electrically connected to the chip 10.

As shown in FIG. 3, the externally connecting terminal 15 is shaped like a bump vertically on the undersurface of the substrate 11, and connected to the wiring pattern 13 via a through-hole wiring 14. Otherwise, as shown in FIG. 4, the terminal 15 is formed as a wiring pattern 152 on an end face of the wiring substrate 11 and connected to the wiring pattern 13 through a blind via-hole wiring 17.

Since the semiconductor device having the above-described package structure undergoes a burn-in-test for applying a temperature stress and/or an electric field stress after resin-sealing, the package structure is superior to the flip-chip mounting without resin sealing.

In order to form the resin-sealed layer 16 shown in FIGS. 3 and 4, for example, liquid resin is supplied from a nozzle of a resin supplier onto the substrate 11, and caused to flow into between the chip and substrate by the surface tension and capillarity of the resin, and then hardened. Thus, the adhesion of the resin-sealed layer 16 and wiring substrate 11 or semiconductor chip 10 becomes poor, the reliability of the resin-sealing lowers, the operability and productivity deteriorate, and the production costs increase.

An example of an improvement of the above single-sided resin-sealed package structure and a method for manufacturing the same, are proposed in, for example, Jpn. Pat. Appln. (KOKAI) Publications Nos. 6-204272 and 1-191457.

Jpn. Pat. Appln. (KOKAI) Publications No. 6-204272 discloses a method for manufacturing a semiconductor device wherein an air vent is formed in a wiring substrate (circuit board), liquid resin is supplied to a gap between a flip chip and the substrate from two directions of the chip and caused to flow into between the chip and substrate by the surface tension and capillarity of the resin, and then hardened. According to this method, the air vent prevents bubbles from remaining in the resin between the chip and substrate.

Jpn. Pat. Appln. (KOKAI) Publication No. 1-191457 teaches a semiconductor device in which a through hole is formed in a flip-chip mounting portion of a wiring substrate (circuit board), and sealing resin is supplied to a gap between a flip chip and the substrate using the through hole as a fluid gate of the sealing resin. However, in this semiconductor device, too, the adhesion of a resin-sealed layer and the wiring substrate or semiconductor chip still remains inadequate, and the reliability of the resin-sealed layer is low.

The prior art semiconductor device having a single-sided resin-sealed package structure and the method for manufacturing the same, has a problem in which the adhesion of the resin-sealed layer and the wiring substrate or semiconductor chip is not necessarily adequate and thus the reliability of the resin-sealed layer is low.

BRIEF SUMMARY OF THE INVENTION

The present invention has been developed to resolve the above problems, and one object thereof is to provide a semiconductor device having a single-sided resin-sealed package structure in which a resin-sealed layer can be improved in reliability by enhancing the adhesion of the resin-sealed layer and a wiring substrate or a semiconductor chip.

Another object of the present invention is to provide a method for manufacturing the same semiconductor device as described above.

According to a first aspect of the present invention, there is provided a semiconductor device comprising:

a wiring substrate having a chip mounting face on which a connected portion is formed;

a semiconductor chip having an element forming face on which externally connecting terminals are formed, the externally connecting terminals being electrically connected to the connected portion; and a resin-sealed layer formed between the wiring substrate and the semiconductor chip so as to cover at least a periphery of the semiconductor chip, wherein the wiring substrate has a through hole bored from the chip mounting face to an undersurface thereof, part of the through hole being formed outside a chip mounting region of the wiring substrate.

According to a second aspect of the present invention, in the semiconductor device of the first aspect, the semiconductor chip is mounted face down such that the element forming face is opposed to the chip mounting face of the wiring substrate.

According to a third aspect of the present invention, in the semiconductor device of the first aspect, the resin-sealed layer is formed by transfer mold.

According to a fourth aspect of the present invention, the semiconductor device of the first aspect further comprises externally connecting terminals formed on the undersurface of the wiring substrate and electrically connected to the semiconductor chip.

According to a fifth aspect of the present invention, in the semiconductor device of the first aspect, the through hole has a main part formed except at an electrically connecting portion between the semiconductor chip and the wiring substrate, and a sub-part extending outside the chip mounting region from part of a periphery of the main part.

According to a sixth aspect of the present invention, in the semiconductor device of the first aspect, the resin-sealed layer covers all over the semiconductor chip.

According to a seventh aspect of the present invention, in the semiconductor device of the first aspect, the through hole has a square main part formed so as to face a region surrounded with the externally connecting terminals, and a sub-part extending outside the chip mounting region from at least one corner portion of the main part.

According to an eighth aspect of the present invention, in the semiconductor device of the fifth aspect, the sub-part of the through hole has a strip-like plane pattern having a width of 0.3 mm or more.

According to a ninth aspect of the present invention, in the semiconductor device of the seventh aspect, the sub-part of the through hole has a strip-like plane pattern having a width of 0.3 mm or more.

According to a tenth aspect of the present invention, in the semiconductor device of the fifth aspect, the main part of the through hole has a corner portion located within a region of at least 0.6 mm×0.6 mm of a corner portion of the chip mounting region.

According to an eleventh aspect of the present invention, in the semiconductor device of the seventh aspect, the corner portion of the main part of the through hole is located within a region of at least 0.6 mm×0.6 mm of a corner portion of the chip mounting region.

According to a twelfth aspect of the present invention, a semiconductor device comprises:

- a wiring substrate having a chip mounting face on which a connected portion is formed;
- a first semiconductor chip having an element forming face on which externally connecting terminals are formed, the externally connecting terminals being electrically connected to the connected portion;
- a second semiconductor chip having an element forming face on which externally connecting terminals are formed, the externally connecting terminals being electrically connected to the connected portion; and
- a resin-sealed layer formed between the wiring substrate and the first semiconductor chip and between the wiring substrate and the second semiconductor chip, so as to cover at least a periphery of each of the first semiconductor chip and the second semiconductor chip,
- wherein the wiring substrate has a first through hole bored from the chip mounting face to an undersurface thereof, part of the first through hole being formed outside a first semiconductor chip mounting region of the wiring substrate, and the wiring substrate has a second through hole bored in the second semiconductor chip from the chip mounting face to an undersurface thereof, part of the second through hole being formed outside a second semiconductor chip mounting region of the wiring substrate.

According to a thirteenth aspect of the present invention, in the semiconductor device of the twelfth aspect, the first semiconductor chip is mounted face down such that the element forming face is opposed to the chip mounting face of the wiring substrate.

According to a fourteenth aspect of the present invention, in the semiconductor device of the twelfth aspect, the second semiconductor chip is mounted face down such that the element forming face is opposed to the chip mounting face of the wiring substrate.

According to a fifteenth aspect of the present invention, in the semiconductor device of the twelfth aspect, the resin-sealed layer is formed by transfer mold.

According to a sixteenth aspect of the present invention, the semiconductor device of the twelfth aspect further comprises externally connecting terminals formed on the undersurface of the wiring substrate and electrically connected to the first semiconductor chip.

According to a seventeenth aspect of the present invention, the semiconductor device of the twelfth aspect further comprises externally connecting terminals formed on the undersurface of the wiring substrate and electrically connected to the second semiconductor chip.

According to an eighteenth aspect of the present invention, in the semicondutor device of the twelfth aspect, the first through hole has a first main part formed except at an electrically connecting portion between the first semiconductor chip and the wiring substrate, and a first sub-part extending outside the first semiconductor chip mounting region from part of a periphery of the first main part.

According to a nineteenth aspect of the present invention, in the semiconductor device of the twelfth aspect, the second through hole has a second main part formed except at an electrically connecting portion between the second semiconductor chip and the wiring substrate, and a second sub-part extending outside the second semiconductor chip mounting region from part of a periphery of the first main part.

According to the twentieth aspect of the present invention, in the semiconductor device of the twelfth aspect, the resin-sealed layer covers all over the first semiconductor chip.

According to the twenty-first aspect of the present invention, in the semiconductor device of the twelfth aspect, the resin-sealed layer covers all over the second semiconductor chip.

According to the twenty-second aspect of the present invention, in the semiconductor device of the twelfth aspect, the first through hole has a square, first main part formed so as to face a region surrounded with the externally connecting terminals, and a first sub-part extending outside the first chip mounting region from at least one corner portion of the first main part.

According to the twenty-third aspect of the present invention, in the semiconductor device of the twelfth aspect, the second through hole has a square, second main part formed so as to face a region surrounded with the externally connecting terminals, and a second sub-part extending outside the second chip mounting region from at least one corner portion of the second main part.

According to the twenty-fourth aspect of the present invention, in the semiconductor device of the eighteenth aspect, the first sub-part of the first through hole has a strip-like plane pattern having a width of 0.3 mm or more.

According to the twenty-fifth aspect of the present invention, in the semiconductor device of the nineteenth aspect, the second sub-part of the second through hole has a strip-like plane pattern having a width of 0.3 mm or more.

According to the twenty-sixth aspect of the present invention, in the semiconductor device of the twenty-second aspect, the first sub-part of the first through hole has a strip-like plane pattern having a width of 0.3 mm or more.

According to the twenty-seventh aspect of the present invention, in the semiconductor device of the twenty-third aspect, the second sub-part of the second through hole has a strip-like plane pattern having a width of 0.3 mm or more.

According to the twenty-eighth aspect of the present invention, in the semiconductor device of the eighteenth aspect, the first main part of the first through hole has a corner portion located within a region of at least 0.6 mm×0.6 mm of a corner portion of the first semiconductor chip mounting region.

According to the twenty-ninth aspect of the present invention, in the semiconductor device of the nineteenth aspect, the second main part of the second through hole has a corner portion located within a region of at least 0.6 mm×0.6 mm of a corner portion of the second semiconductor chip mounting region.

According to the thirtieth aspect of the present invention, in the semiconductor device of the twenty-second aspect, the first main part of the first through hole has a corner portion located within a region of at least 0.6 mm×0.6 mm of a corner portion of the first chip mounting region.

According to the thirty-first aspect of the present invention, in the semiconductor device of the twenty-third aspect, the corner portion of the first main part of the first through hole is located within a region of at least 0.6 mm×0.6 mm of a corner portion of the first semiconductor chip mounting region.

According to the thirty-second aspect of the present invention, a semiconductor device comprises:
- a wiring substrate having a chip mounting face on which a connected portion is formed;
- a semiconductor chip having an element forming face on which externally connecting terminals are formed, the externally connecting terminals being electrically connected to the connected portion; and
- a resin-sealed layer formed between the wiring substrate and the semiconductor chip so as to cover at least a periphery of the semiconductor chip,
- wherein the wiring substrate has a groove extending outward from a chip mounting region.

According to the thirty-third aspect of the present invention, in the semiconductor device of the thirty-second aspect, the groove has a depth of 0.25 mm or more.

According to the thirty-fourth aspect of the present invention, in the semiconductor device of the thirty-second aspect, the semiconductor chip is mounted face down such that the element forming face is opposed to the chip mounting face of the wiring substrate.

According to the thirty-fifth aspect of the present invention, in the semiconductor device of the thirty-second aspect, the resin-sealed layer is formed by transfer mold.

According to the thirty-sixth aspect of the present invention, the semiconductor device of the thirty-second aspect further comprises externally connecting terminals formed on the undersurface of the wiring substrate and electrically connected to the semiconductor chip.

According to the thirty-seventh aspect of the present invention, in the semiconductor device of the thirty-second aspect, the resin-sealed layer covers all over the semiconductor chip.

According to the thirty-eighth aspect of the present invention, in the method for manufacturing a semiconductor device including a wiring substrate having a chip mounting face on which a connected portion is formed, a semiconductor chip having an element forming face on which externally connecting terminals are formed, and a through hole bored in the wiring substrate from the chip mounting face to an undersurface thereof, part of the through hole being formed outside a chip mounting region, the method comprising the steps of:
- connecting the externally connecting terminals of the semiconductor chip and the connected portion of the wiring substrate; and
- supplying resin between the semiconductor chip and the wiring substrate and into the through hole by transfer mold.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a cross-sectional view of the semiconductor device taken along line 7—7 of FIG. 6;

FIG. 11 is a plan view of the upper face of a semiconductor device having a single-sided resin-sealed package structure according to a second embodiment of the present invention;

FIG. 12 is a cross-sectional view of the semiconductor device taken along line 12—12 of FIG. 11;

FIG. 13 is a cross-sectional view illustrating a semiconductor device having a single-sided resin-sealed package structure according to a third embodiment of the present invention;

FIG. 14 a cross-sectional view illustrating a semiconductor device having a single-sided resin-sealed package structure according to a fourth embodiment of the present invention; and FIG. 15 is a cross-sectional view illustrating a semiconductor device having a single-sided resin-sealed package structure according to a fifth embodiment of the present invention.

DETAILED DESCRIPTION OF THE INVENTION

Embodiments of the present invention will now be described with reference to the accompanying drawings.

Figure 1:
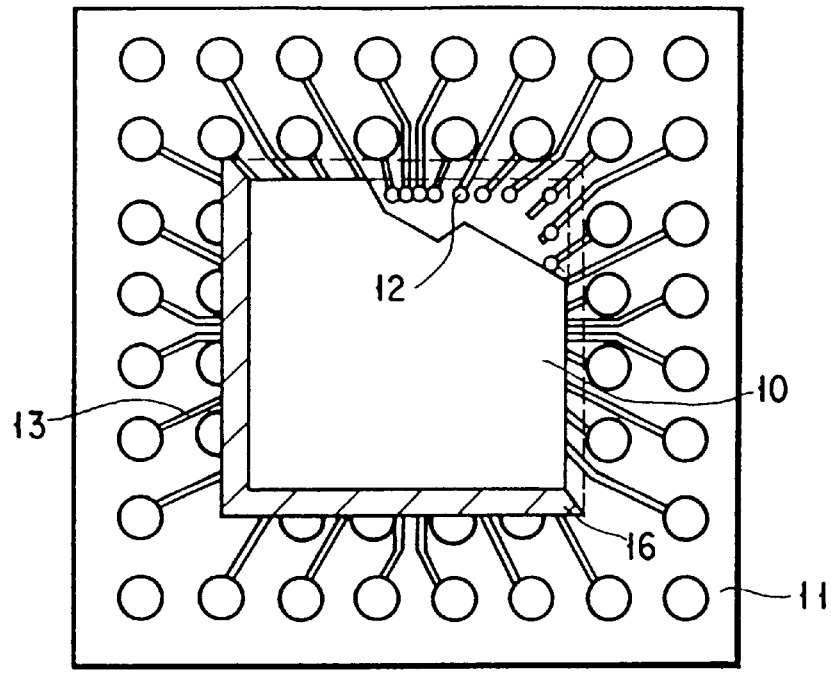
FIG. 1 is a plan view of the upper face of a prior art semiconductor device having a single-sided resin-sealed package structure.
Figure 2:
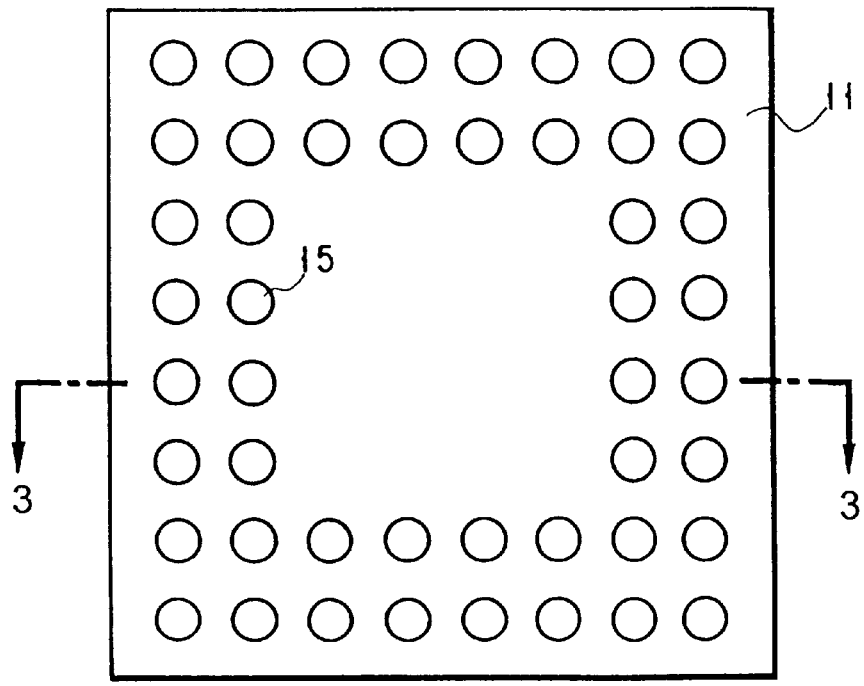
FIG. 2 is a plan view of the lower face of the semiconductor device illustrated in FIG. 1.
Figure 3:
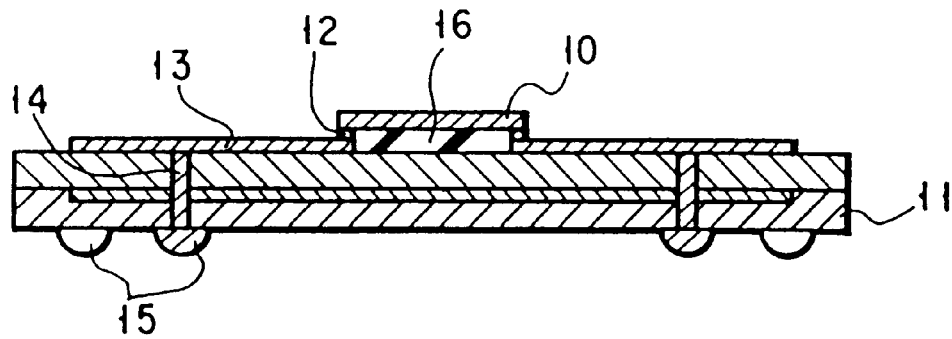
FIG. 3 is a cross-sectional view of the semiconductor device taken along line 3—3 of FIG. 2.
Figure 4:
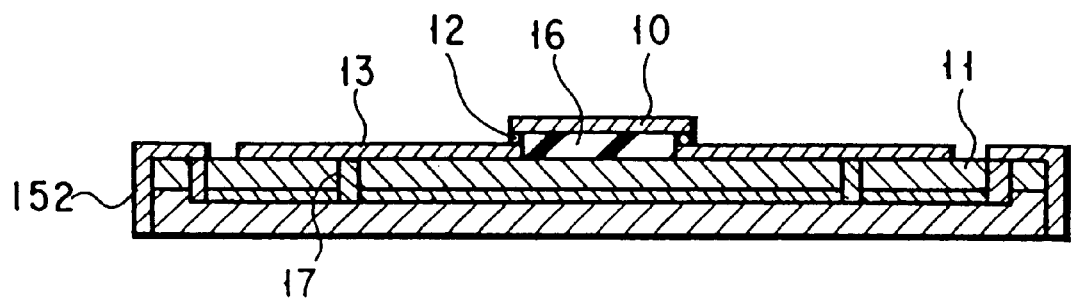
FIG. 4 is a cross-sectional view of another prior art semiconductor device having a single-sided resin-sealed package structure.
Figure 5:
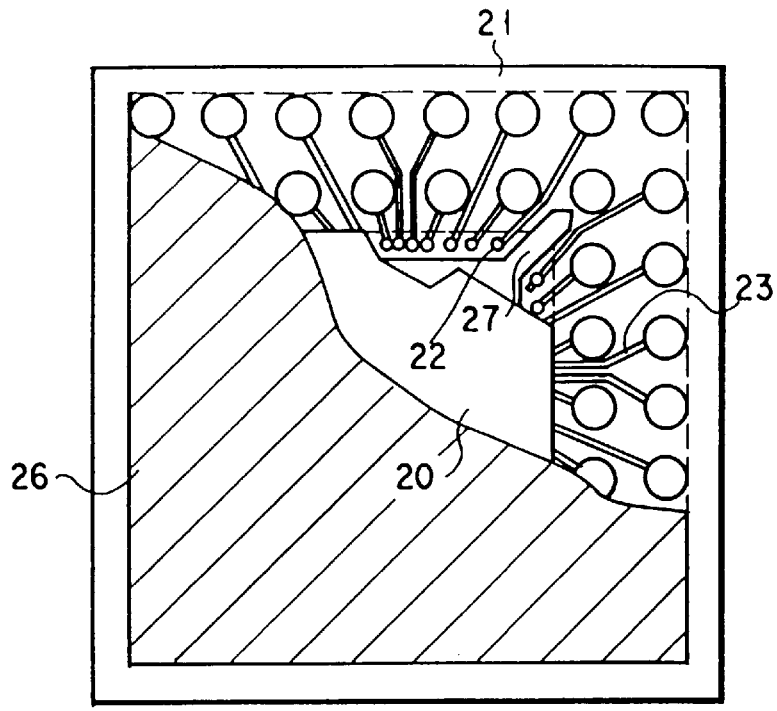
FIG. 5 is a plan view of the upper face of a semiconductor device having a single-sided resin-sealed package structure according to a first embodiment of the present invention.
Figure 6:
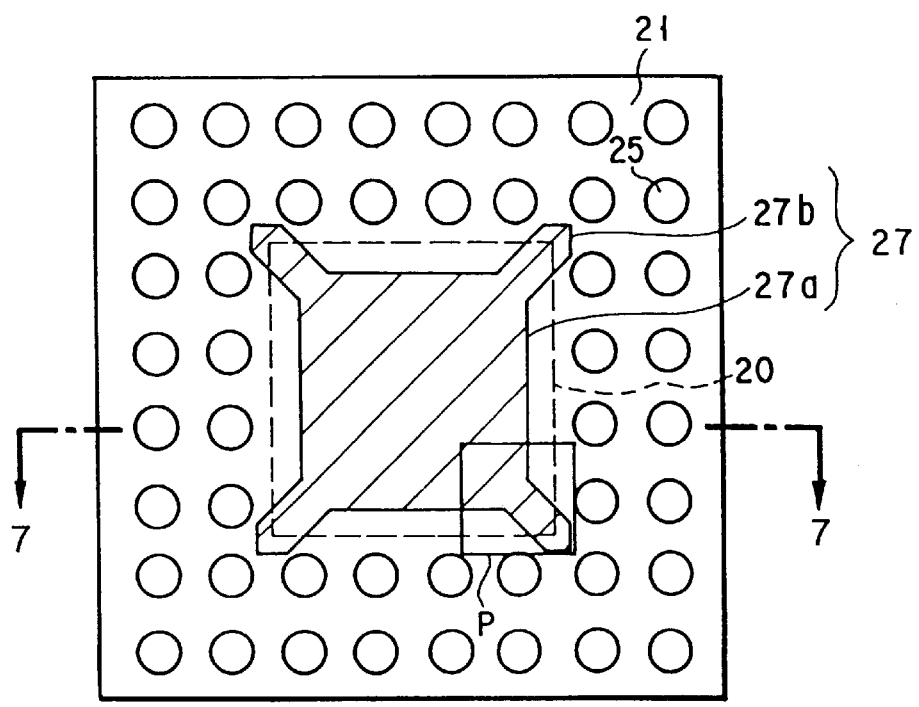
FIG. 6 is a plan view of the lower face of the semiconductor device of FIG. 5.
Figure 8:
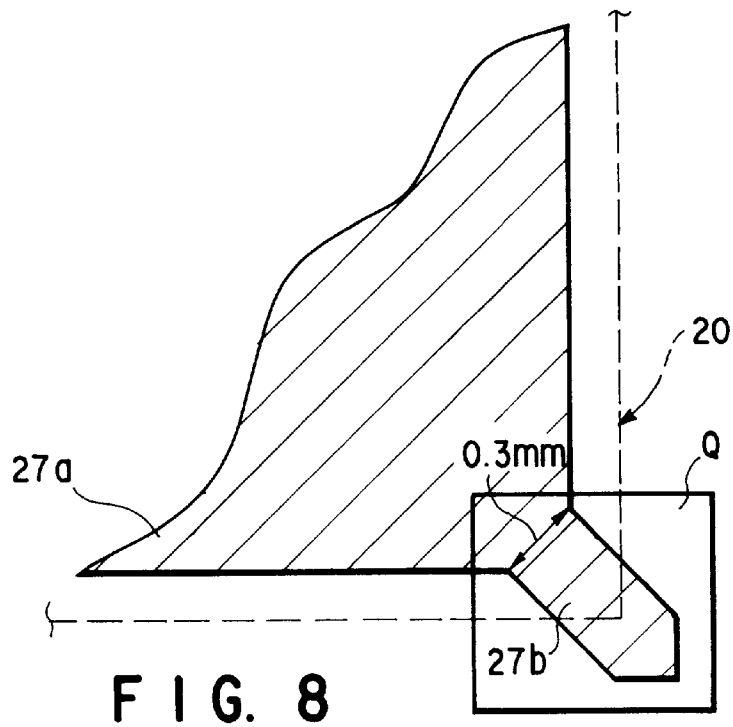
FIG. 8 is an enlarged view of region P of FIG. 6.
Figure 9:
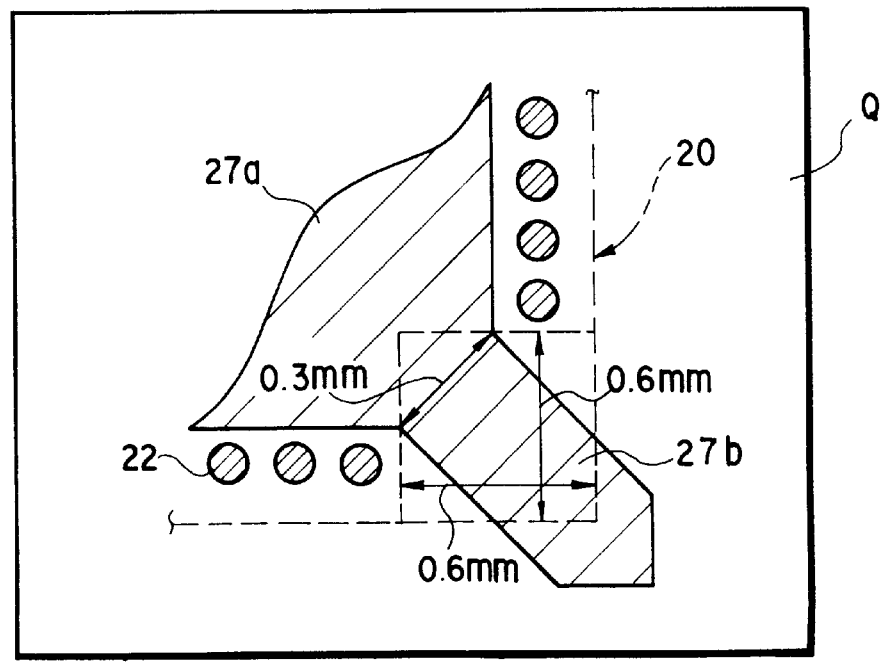
FIG. 9 is an enlarged view of region Q of FIG. 6.

FIG. 5 is a plan view of the upper face of a semiconductor device having a single-sided resin-sealed package structure according to a first embodiment of the present invention. FIG. 6 is a plan view of the lower face of the semiconductor device of FIG. 5. FIG. 7 is a cross-sectional view of the semiconductor device taken along line 7—7 of FIG. 6. FIG. 8 is an enlarged view of region P of FIG. 6, while FIG. 9 is an enlarged view of region Q of FIG. 6.

The semiconductor device illustrated in FIGS. 5 to 9 includes a wiring substrate 21, a semiconductor chip 20, a resin-sealed layer 26, and an externally connecting terminal 25. The substrate 21 has a wiring pattern 23 including a connected portion on a chip mounting face thereof and a through hole 27. The chip 20 has an externally connecting terminal group (metal bump electrode group) 22 on an element forming face thereof. The element forming face is mounted down on the chip mounting face of the substrate 21, and the externally connecting terminal group is electrically connected to the connected portion. The resin-sealed layer 26 is formed between the chip 20 and substrate 21 and transfer-molded by transfer-mold so as to cover the sides and upper face of the chip 20. The terminal 25 is guided and exposed to the no-chip mounting face (corresponding to the underside of the chip in this embodiment) of the substrate 21 and electrically connected to the chip 20.

In the first embodiment, the wiring substrate 21 has a multilayer structure wherein the externally connecting terminal 25 is connected to the wiring pattern 23 via a through hole wiring 28. The terminal 25 is shaped like a bump vertically on the substrate 21. In FIG. 7, 23a indicates an interlayer wiring pattern.

The through hole 27 is constituted of a main part 27a and a sub-part 27b. The main part 27a is located so as to avoid the electrically connecting portion between the chip and substrate, while the sub-part 27b is formed like a branch so as to extend outside the chip mounting region from part of the outer circumference of the main part 27a. In the first embodiment, as shown in FIG. 6, the main part 27a of the through hole 27 is square and formed in substantially the central part of the wiring substrate 21 so as to face a region surrounded with the bump electrode group forming region of the chip 20. The sub-part 27b extends outside the chip mounting region from each of four corners of the main part 27a.

Considering the characteristics of resin of the resin-sealed layer 26 used in transfer molding, the size of an inlet of the resin supplier, etc., as shown in FIG. 9, each corner of the main part 27a is located within at least 0.6 mm×0.6 mm region of a corner portion of the chip mounting region, and the plane pattern of the sub-part 27b has a width of 0.3 mm or more. The sub-part 27b is formed like a strip. In other words, the bump electrode group 22 of the chip 20 is formed except in the 0.6 mm×0.6 mm region.

The chip 20 or substrate 21 is not limited to a square but can be rectangular. The substrate 21 can be replaced with an alumina type substrate, an aluminum nitride type substrate and a resin type substrate (e.g., a BT resin substrate).

The substrate 21 is not limited to one from which the wiring pattern 23 protrudes, but can be replaced with one whose surface is substantially flush with the wiring pattern 23 (e.g., a substrate obtained from an alumina type insulating base material by the green sheet technique and a substrate obtained from a resin type insulating base material by the prepreg technique).

A method for manufacturing a semiconductor device according to the first embodiment will now be described.

Figure 10A:
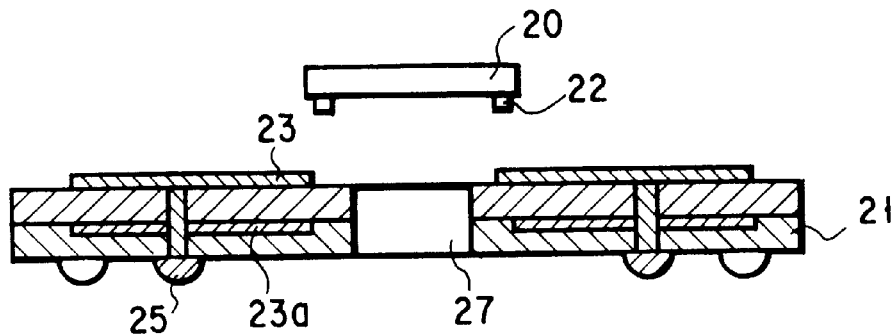
FIG. 10A is a cross-sectional view illustrating a step of manufacturing the semiconductor device of the first embodiment.

As illustrated in FIG. 10A, a chip 20, which includes a bump electrode 22 of conductive material such as metal on an externally connecting pad portion of an element forming face, is prepared. For example, the bump electrode 22 is a gold bump formed by electric plating or a gold ball bump formed by ball bonding.

A wiring substrate 21, which includes a wiring pattern 23 including a connected portion and formed on a chip mounting face thereof so as to slightly protrude from an insulating base material, a single through hole 27, and an externally connecting terminal 25 guided and exposed to the no-chip mounting face (corresponding to the underside of the chip in this embodiment) via a through-hole wiring from the connected portion. The wiring pattern 23 slightly protrudes from the surface of the insulating base material.

In the first embodiment, the through hole 27 of the substrate 21 is located except in the connected portion (almost in the central part of the substrate), and a sub-part 27b of the hole 27 extends outside the chip mounting region from each of four corners of a square main part 27a of the hole 27.

In order to form the connected portion on the chip mounting face of the substrate 21, the substrate 21 having the wiring pattern 23 on the chip mounting face is fixed onto a stage of, e.g., a screen printing machine with a vacuum adsorption mechanism and, for example, a plane connecting pad is formed on a portion of the substrate 21 corresponding to the metal bump electrode 22 of the chip 20.

Using a metal mask having an opening corresponding to the bump electrode 22, the connecting pad is formed by screen-printing conductive paste such as silver paste on the wiring forming face of the substrate.

Figure 10B:
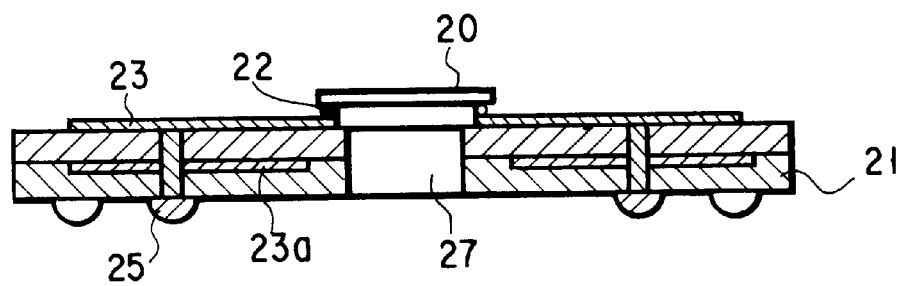
FIG. 10B is a cross-sectional view illustrating another step of manufacturing the semiconductor device of the first embodiment.

As illustrated in FIG. 10B, flip-chip bonding is performed in order to mount the chip 20 face down on the substrate 21, using a bonding machine having a mechanism capable of vacuum adsorption of chip 20.

The bump electrode 22 corresponding to the chip is arranged opposite to the connecting pad of the substrate 21, and both the electrode 22 and connecting pad are fixed by pressing and burying at least an end portion of the bump electrode 24 in the connecting pad by depressing a bonding head. In this condition, they are bonded to each other by thermally hardening silver paste for the connecting pad.

The bump electrode 22 can be formed not on the chip side but on the substrate side.

The present invention is not limited to the foregoing method of pressing and burying at least the end portion of the bump electrode in the connecting pad in order to flip-chip-bond the chip 20 on the substrate. For example, the connecting pad and gold bump electrode can be bonded to each other by solid phase diffusion therebetween.

Figure 10C:
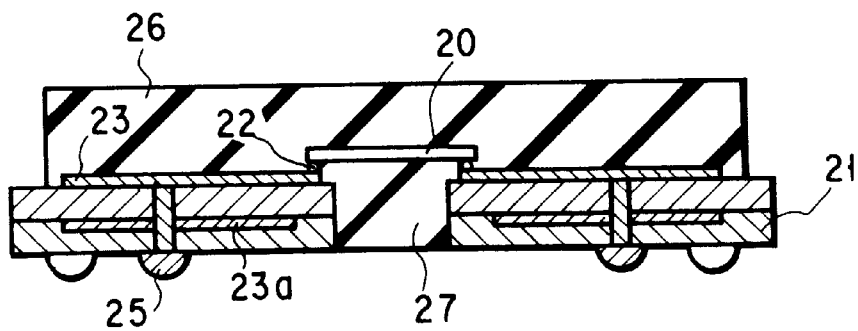
FIG. 10C is a cross-sectional view illustrating still another step of manufacturing the semiconductor device of the first embodiment.

In the flip chip bonding of the chip 20 on the substrate 21, as shown in FIG. 10C, the substrate and chip are set in a cavity of a mold of a resin-sealing transfer mold device without causing a gap therebetween in the up-and-down direction. The substrate and chip are resin-sealed by the transfer mold to supply the resin to between the chip and substrate and to form a resin-sealed layer 26 so as to almost uniformly cover the outsides of the chip with resin.

According to the above-described manufacturing method, the chip 20 is flip-chip-bonded to the wiring substrate 21, which has the through hole 27 whose sub-part 27b extends outside the chip mounting region from four corners of the main part 27a, and resin-sealed by the transfer mold.

Thus, a semiconductor device having a single-sided resin-sealed package structure is obtained wherein the resin is supplied between the chip and substrate and the resin-sealed layer 26 is formed so as to almost uniformly cover the outsides of the chip with resin.

Since the through hole 27 is formed outside the chip mounting region, the resin can be supplied into the through hole 27 and between the chip 20 and substrate 21 at once.

Since, furthermore, the resin is supplied into the sub-part 27b of the through hole 27 as well as the main part 27a thereof, the chip 20 and substrate 21 are mechanically and firmly fixed to the resin-sealed layer 26, and the stress caused by heat or the like is almost uniformly applied to the entire chip, thus improving in reliability of the device.

In the first embodiment described above, a single through hole 27 is formed in substantially the central part of the substrate 21. However, any number of openings (including through holes and grooves) can be formed on the substrate except in the chip connecting portion of the substrate.

FIG. 11 is a plan view of the upper face of a semiconductor device having a single-sided resin-sealed package structure according to a second embodiment of the present invention, and FIG. 12 is a cross-sectional view of the semiconductor device taken along line 12—12 of FIG. 11. In these figures, the same constituting elements as those of FIGS. 5 to 7 are indicated by the same reference numerals.

The semiconductor device of the second embodiment differs from that of the first embodiment in that two through holes 271 and 272 are formed and two chips 201 and 202 are sealed with resin.

FIG. 13 is a cross-sectional view illustrating a semiconductor device having a single-sided resin-sealed package structure according to a third embodiment of the present invention. In FIG. 13, the same constituting elements as those of FIGS. 5 to 7 are indicated by the same reference numerals.

The semiconductor device of the third embodiment differs from that of the first embodiment in that a groove 29 is formed on the wiring substrate 21 in place of the through hole. More specifically, in the third embodiment, a single groove 29 is formed in almost the central part of the chip mounting face of the wiring substrate, except in the electrical connecting portion between the chip 20 and substrate 21, and filled with resin.

As the through hole of the first embodiment, the groove 29 is constituted of a main part and a sub-part, and the sub-part extends from at least part of the outer circumference of the main part to the position outside the externally connecting terminal group forming region of the chip.

Considering the characteristics of resin of the resin-sealed layer 26 used in transfer molding, the size of an inlet of the resin supplier, etc., the depth of the groove is set to 0.25 mm or more.

In the foregoing third embodiment, one groove is formed. As in the second embodiment, when a plurality of semiconductor chips are mounted on the wiring substrate 21, a plurality of grooves corresponding thereto can be formed.

FIG. 14 is a cross-sectional view illustrating a semiconductor device having a single-sided resin-sealed package structure according to a fourth embodiment of the present invention. In FIG. 14, the same constituting elements as those of FIGS. 5 to 7 are indicated by the same reference numerals.

The semiconductor device of the fourth embodiment differs from that of the first embodiment in that the wiring substrate 21 and chip 20 are sealed with a resin-sealing layer 261 so as to expose the upper face of the chip 20. If such a constitution is adopted, the problem with reliability can be reduced since the exposed upper face of the chip 20 is formed of close, strong materials (e.g., silicon).

FIG. 15 is a cross-sectional view illustrating a semiconductor device having a single-sided resin-sealed package structure according to a fifth embodiment of the present invention. In FIG. 15, the same constituting elements as those of FIGS. 5 to 7 are indicated by the same reference numerals.

The semiconductor device of the fifth embodiment differs from that of the first embodiment in that an externally connecting terminal is formed on an end face of the wiring substrate 21 as a wiring pattern 251 and the wiring pattern 251 is connected to the wiring pattern 23 through an interlayer wiring pattern 23a and a blind via hole wiring 30.

According to the present invention described above, there can be provided a semiconductor device having a single-sided resin-sealed package structure and a method for manufacturing the same, which increases in adhesion between the wiring substrate or semiconductor chip and the resin-sealed layer and improves in reliability of the resin-sealed layer.

What is claimed is:

1. A semiconductor device comprising:
    a wiring substrate having a chip mounting face on which a connected portion is formed;
    a semiconductor chip having an element forming face on which externally connecting terminals are formed, said externally connecting terminals being electrically connected to said connected portion; and
    a resin-sealed layer formed between said wiring substrate and said semiconductor chip so as to cover at least a periphery of said semiconductor chip,
    wherein said wiring substrate has a through hole supplied with a resin for fixing the semiconductor chip, wherein the through hole is bored from the chip mounting face to an undersurface thereof, the through hole having a main part and a sub-part, the main part formed to avoid the electrically connected portion between the semiconductor chip and the wiring substrate and the sub-Part formed as a branch extending from part of a periphery of the main part.

2. The semiconductor device according to claim 1, wherein said semiconductor chip is mounted face down such that the element forming face is opposed to the chip mounting face of said wiring substrate.

3. The semiconductor device according to claim 1, wherein said resin-sealed layer is formed by transfer mold.

4. The semiconductor device according to claim 1, further comprising externally connecting terminals formed on the undersurface of said wiring substrate and electrically connected to said semiconductor chip.

5. The semiconductor device according to claim 1, wherein said resin-sealed layer covers all over said semiconductor chip.

6. The semiconductor device according to claim 1, wherein said through hole has a square main part formed so as to face a region surrounded with said externally connecting terminals, and the sub-part extending outside the chip mounting region from at least one corner portion of said main part.

7. The semiconductor device according to claim 6, wherein the sub-part of said through hole has a strip-like plane pattern having a width of 0.3 mm or more.

8. The semiconductor device according to claim 6, wherein the corner portion of the main part of said through hole is located within a region of at least 0.6 mm×0.6 mm of a corner portion of the chip mounting region.

9. The semiconductor device according to claim 1, wherein the sub-part of said through hole has a strip-like plane pattern having a width of 0.3 mm or more.

10. The semiconductor device according to claim 1, wherein the main part of said through hold has a corner portion located within a region of at least 0.6 mm×0.6 mm of a corner portion of the chip mounting region.

11. A semiconductor device comprising:

a wiring substrate having a chip mounting face on which a connected portion is formed;

a first semiconductor chip having an element forming face on which externally connecting terminals are formed, said externally connecting terminals being electrically connected to said connected portion;

a second semiconductor chip having an element forming face on which externally connecting terminals are formed, said externally connecting terminals being electrically connected to said connected portion; and a resin-sealed layer formed between said wiring substrate and said first semiconductor chip and between said wiring substrate and said second semiconductor chip, so as to cover at least a periphery of each of said first semiconductor chip and said second semiconductor chip, wherein said wiring substrate has a first through hole bored from the chip mounting face to an undersurface thereof, part of said first through hole extending outside an area defined by the first semiconductor chip mounting region of said wiring substrate, and said wiring substrate has a second through hole bored in said second semiconductor chip from the chip mounting face to an undersurface thereof, part of said second through hole extending outside an area defined by the second semiconductor chip mounting region of said wiring substrate, wherein the first and the second through holes have a main part and a sub-part, the main part formed to avoid the electrically connected portion and the sub-part formed as a branch extending from part of a periphery of the main part and, wherein the first hole is supplied with a resin for fixing the first semiconductor chip and the second through hole is supplied with the resin for fixing the second semiconductor chip.

12. The semiconductor device according to claim 11, wherein said first semiconductor chip is mounted face down such that the element forming face is opposed to the chip mounting face of said wiring substrate.

13. The semiconductor device according to claim 11, wherein said second semiconductor chip is mounted face down such that the element forming face is opposed to the chip mounting face of said wiring substrate.

14. The semiconductor device according to claim 11, wherein said resin-sealed layer is formed by transfer mold.

15. The semiconductor device according to claim 11, further comprising externally connecting terminals formed on the undersurface of said wiring substrate and electrically connected to said first semiconductor chip.

16. The semiconductor device according to claim 11, further comprising externally connecting terminals formed on the undersurface of said wiring substrate and electrically connected to said second semiconductor chip.

17. The semiconductor device according to claim 11, wherein said first through hole has a first main part formed except at an electrically connecting portion between said first semiconductor chip and said wiring substrate, and a first sub-part extending outside the first semiconductor chip mounting region from part of a periphery of said first main part.

18. The semiconductor device according to claim 17, wherein the first sub-part of said first through hole has a strip-like plane pattern having a width of 0.3 mm or more.

19. The semiconductor device according to claim 17, wherein the first main part of said first through hole has a corner portion located within a region of at least 0.6 mm×0.6 mm of a corner portion of the first semiconductor chip mounting region.

20. The semiconductor device according to claim 11, wherein said second through hole has a second main part formed except at an electrically connecting portion between said second semiconductor chip and said wiring substrate, and a second sub-part extending outside the second semiconductor chip mounting region from part of a periphery of said first main part.

21. The semiconductor device according to claim 20, wherein the second sub-part of said second through hole has a strip-like plane pattern having a width of 0.3 mm or more.

22. The semiconductor device according to claim 20, wherein the second main part of said second through hole has a corner portion located within a region of at least 0.6 mm×0.6 mm of a corner portion of the second semiconductor chip mounting region.

23. The semiconductor device according to claim 11, wherein said resin-sealed layer covers all over said first semiconductor chip.

24. The semiconductor device according to claim 11, wherein said resin-sealed layer covers all over said second semiconductor chip.

25. The semiconductor device according to claim 11, wherein said first through hole has a square, first main part formed so as to face a region surrounded with said externally connecting terminals, and a first sub-part extending outside the first chip mounting region from at least one corner portion of said first main part.

26. The semiconductor device according to claim 25, wherein the first sub-part of said first through hole has a strip-like plane pattern having a width of 0.3 mm or more.

27. The semiconductor device according to claim 25, wherein the first main part of said first through hole has a corner portion located within a region of at least 0.6 mm×0.6 mm of a corner portion of the first chip mounting region.

28. The semiconductor device according to claim 11, wherein said second through hole has a square, second main part formed so as to face a region surrounded with said externally connecting terminals, and a second sub-part extending outside the second chip mounting region from at least one corner portion of said second main part.

29. The semiconductor device according to claim 28, wherein the second sub-part of said second through hole has a strip-like plane pattern having a width of 0.3 mm or more.

30. The semiconductor device according to claim 28, wherein the corner portion of the first main part of said first through hole is located within a region of at least 0.6 mm×0.6 mm of a corner portion of the first semiconductor chip mounting region.

31. A semiconductor device comprising:
- a wiring substrate having a chip mounting face on which a connected portion is formed;
- a semiconductor chip having an element forming face on which externally connecting terminals are formed, said externally connecting terminals being electrically connected to said connected portion; and
- a resin-sealed layer formed between said wiring substrate and said semiconductor chip so as to cover at least a periphery of said semiconductor chip,
- wherein said wiring substrate has a groove extending outward beyond the area defined by a chip mounting region, the groove having a main part and a sub-part, the main part formed to avoid the electrically connected portion and the sub-part formed as a branch extending from part of a periphery of the main part and the groove is supplied with a resin for fixing the semiconductor chip.

32. The semiconductor device according to claim 31, wherein said groove has a depth of 0.25 mm or more.

33. The semiconductor device according to claim 31, wherein said semiconductor chip is mounted face down such that the element forming face is opposed to the chip mounting face of said wiring substrate.

34. The semiconductor device according to claim 31, wherein said resin-sealed layer is formed by transfer mold.

35. The semiconductor device according to claim 31, further comprising externally connecting terminals formed on the undersurface of said wiring substrate and electrically connected to said semiconductor chip.

36. The semiconductor device according to claim 31, wherein said resin-sealed layer covers all over said semiconductor chip.

* * * * *

UNITED STATES PATENT AND TRADEMARK OFFICE
CERTIFICATE OF CORRECTION

PATENT NO.    : 6,107,689
DATED         : August 22, 2000
INVENTOR(S)   : Hiroyuki Kozono It is certified that error appears in the above-identified patent and that said Letters Patent is hereby corrected as shown below:

Column 10, claim 1,
Lines 52-53, "sub-Part" should read -- sub-part --.

Column 11, claim 10,
Line 19, "through hold" should read -- through hole --.

Signed and Sealed this

Twelfth Day of March, 2002

Attest:

Attesting Officer

JAMES E. ROGAN
Director of the United States Patent and Trademark Office